United States Patent [19]

Crilly, Jr.

[11] 4,234,849
[45] Nov. 18, 1980

[54] PROGRAMMABLE FREQUENCY DIVIDER AND METHOD

[75] Inventor: William J. Crilly, Jr., Palo Alto, Calif.

[73] Assignee: Hewlett-Packard Company, Palo Alto, Calif.

[21] Appl. No.: 850,126

[22] Filed: Nov. 10, 1977

Related U.S. Application Data

[63] Continuation-in-part of Ser. No. 708,467, Jul. 26, 1976, abandoned.

[51] Int. Cl.³ .......................................... H03K 21/36
[52] U.S. Cl. .................................. 328/46; 307/225 R
[58] Field of Search ...................... 307/225 R, 220 R; 328/39, 46, 41

[56] References Cited

U.S. PATENT DOCUMENTS

| | | | |
|---|---|---|---|
| 3,341,693 | 9/1967 | Hurst | 328/46 X |
| 3,493,872 | 2/1970 | Sepe | 328/39 |
| 3,546,597 | 12/1970 | Lipke | 328/46 |
| 3,725,791 | 4/1973 | Moreau et al. | 328/46 X |
| 3,811,092 | 5/1974 | Charbonnier | 328/39 |
| 3,818,354 | 6/1974 | Tomisawa et al. | 328/46 X |
| 3,982,199 | 9/1976 | Green | 328/39 X |

FOREIGN PATENT DOCUMENTS

| | | |
|---|---|---|
| 2310268 | 9/1973 | Fed. Rep. of Germany ............. 328/46 |
| 2341939 | 6/1974 | Fed. Rep. of Germany ............. 328/46 |

OTHER PUBLICATIONS

Kalb, "Programmable Divider Applications"; Nat'l. Semiconductor Corp. (pub.); 10/1968; pp. 1-8.
Steinbach, "IC Frequency Dividers & Counters, Part 2;" Electronics World (pub.); pp. 49-52 & 55; 1/1969.

Primary Examiner—Larry N. Anagnos
Attorney, Agent, or Firm—A. C. Smith

[57] ABSTRACT

A high frequency programmable frequency divider operates in a digital manner to divide the frequency of an applied signal by an integer value greater than five. The frequency divider combines emitter coupled logic (ECL) devices to perform a frequency divide algorithm at frequencies of 220 MHz.

11 Claims, 3 Drawing Figures

| D0 D1 D2 D3 | A B | ÷N | SEQUENCE |
|---|---|---|---|
| 0 0 0 1 | 0 0 | 6 | 3 3 |
| 0 0 0 1 | 1 0 | 6 | 3 3 |
| 0 0 0 1 | 0 1 | 6 | 3 3 |
| 0 0 0 1 | 1 1 | 7 | 4 3 |
| 0 0 1 1 | 0 0 | 9 | 3 3 3 |
| 0 0 1 1 | 1 0 | 9 | 3 3 3 |
| 0 0 1 1 | 0 1 | 10 | 4 3 3 |
| 0 0 1 1 | 1 1 | 11 | 4 4 3 |
| 0 1 1 1 | 0 0 | 12 | 3 3 3 3 |
| 0 1 1 1 | 1 0 | 13 | 4 3 3 3 |
| 0 1 1 1 | 0 1 | 14 | 4 4 3 3 |
| 0 1 1 1 | 1 1 | 15 | 4 4 4 3 |
| 1 1 1 1 | 0 0 | 16 | 4 3 3 3 3 |
| 1 1 1 1 | 1 0 | 17 | 4 4 3 3 3 |
| 1 1 1 1 | 0 1 | 18 | 4 4 4 3 3 |
| 1 1 1 1 | 1 1 | 19 | 4 4 4 4 3 |

PROGRAMMING TABLE

PROGRAMMABLE FREQUENCY DIVIDER AND METHOD

RELATED APPLICATION

This is a continuation-in-part application of pending application Ser. No. 708,467, entitled PROGRAMMABLE FREQUENCY DIVIDER AND METHOD, filed on July 26, 1976 by William J. Crilly, Jr., and now abandoned.

BACKGROUND OF THE INVENTION

At frequencies of 200 MHz, digital frequency dividers become difficult to implement. Presently, the fastest commercially available logic family, commonly known as MECL III, has a worst case setup time of approximately 0.5 nsec per flip-flop, a worst case delay time of approximately 2.9 nsec per flip-flop, and a worst case delay time of approximately 1.0 nsec per gate. At 200 MHz a signal period is approximately 4.5 nsec; thus to allow real time processing of an applied signal, any feedback control requiring a response time within a signal period must have a critical timing path of less than 4.5 nsec.

SUMMARY OF THE INVENTION

Accordingly, the present invention combines emitter coupled logic (ECL) devices to perform a frequency divide algorithm that satisfies the critical timing requirements. The first stage of the circuit performs a partial frequency divide of the applied signal by dividing the frequency of the applied signal with a selectable partial divisor of three or four. The second stage selects the partial divisor used by the first stage and detects the desired number of first stage partial divisions before generating an output pulse and initializing a new sequence.

DESCRIPTION OF THE DRAWING

FIG. 3 is a programming table which sets forth the input conditions for selected frequency division ratios.

DESCRIPTION OF THE PREFERRED EMBODIMENT

Figure 1:
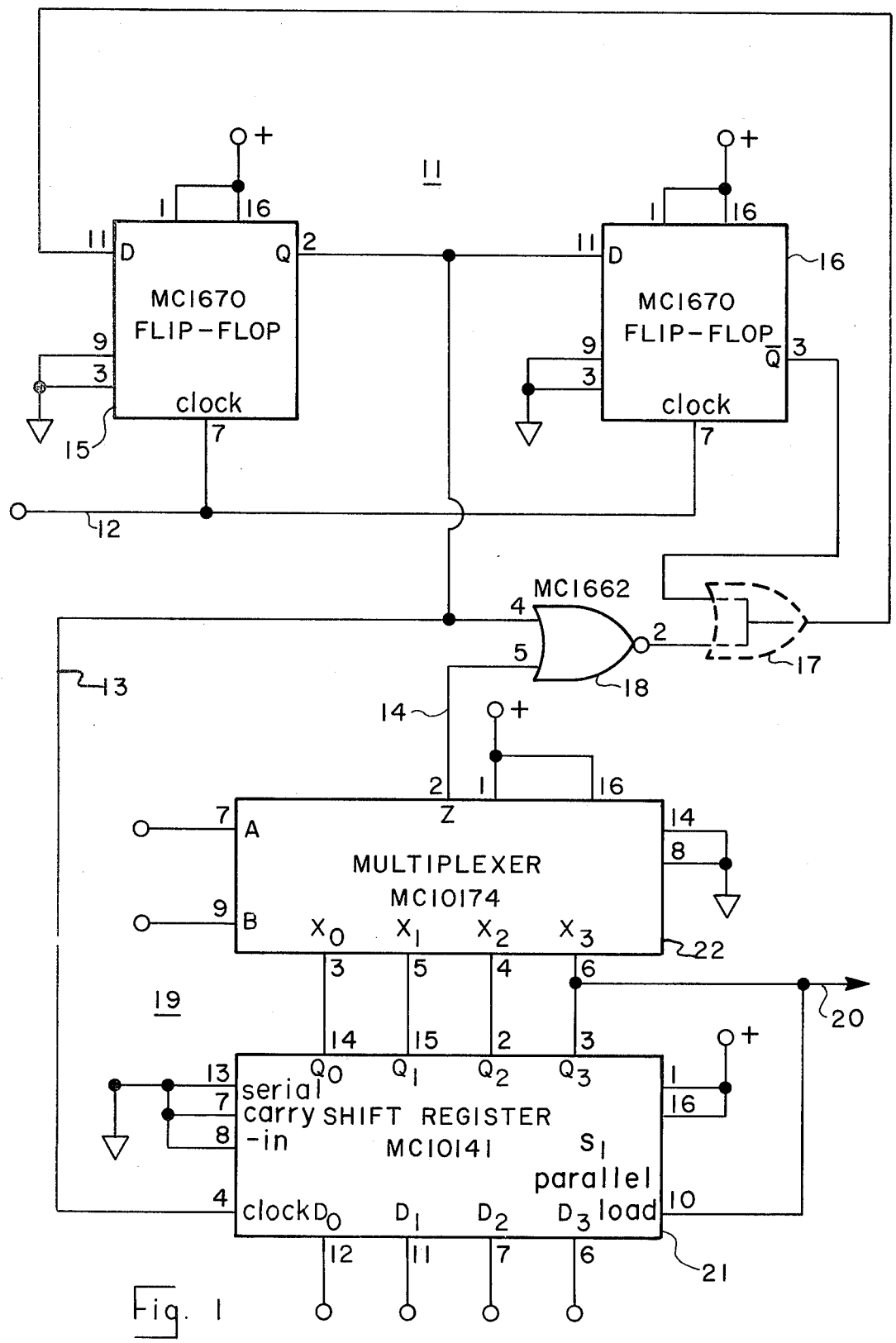
FIG. 1 is a simplified schematic diagram of the programmable divider of the present invention.

Referring to FIG. 1, there is shown a frequency divider comprising a ¾ divider circuit which receives an applied digital signal at an input 12, divides the applied signal with a partial divisor of three or four determined by a ¾ select line 14 and generates a partially divided signal on an output line 13 having a frequency of one-third or one-fourth the frequency of the applied signal. As used in this description, ¾ divider means a frequency divider with a selectable divisor of three or four. A ¾ divider 11 may be implemented using a combination of bistable switching elements such as D type flip-flops 15 and 16 (Motorola Model MC 1670), a NOR gate 18 (Motorola Model MC 1662) and a wired-OR gate 17 which is formed by the connection of the $\overline{Q}$ output of flip-flop 16 and the output of NOR gate 18, all connected as shown. The input 12 is connected to the clock input of each of the D-type flip-flops 15 and 16. The D input of flip-flop 15 is connected by a wired-OR gate 17 to the Q output of flip-flop 16 and to the output of NOR gate 18. The Q output of flip-flop 15 is connected to the D input of flip-flop 16 and an input of NOR gate 18. The other input of NOR gate 18 is connected to the ¾ control line 14. A logical zero level on the ¾ select line 14 will cause the ¾ divider 11 to divide by three and generate a signal on line 13 having a frequency of one-third the frequency of the applied signal. A logical one level on the ¾ select line 14 will cause the ¾ divider 11 to divide by four and generate a signal on line 13 having a frequency of one-fourth the frequency of the applied signal.

The wired-OR gate 17 eliminates a gate propagation delay from the critical timing path of the ¾ divider 11. Thus, the critical timing path within the ¾ divider 11 is one flip-flop delay, from the D input of flip-flop 15 through flip-flop 15, and one gate delay, through NOR gate 18 to the D input of flip-flop 15.

Also shown is a ¾ contrller circuit which receives the signal on line 13 from the ¾ divider 11 and a plurality of applied control signals, and generates the ¾ select signal on line 14 and the frequency divided output on line 20. A ¾ controller 19 may be implemented using a shift register 21 and a multiplexer 22. Line 13 from the ¾ divider 11 is connected to the clock input of shift register 21 which comprises a plurality of interconnected cells capable of storing data. An output signal from the ¾ divider 11 on line 13 causes the shift register 21 to serially shift the data stored in the cells until the appropriate load level is shifted into a selected shift register cell, such as the last cell of the shift register, $S_n$, which acts as a reference condition or point in the shifting process. When the load level is shifted into the last cell, $Q_n$, a signal on the clock input will cause the shift register to be parallel-loaded with a plurality of applied inputs, such as the signals applied to $D_0$, $D_1$, $D_2$, $D_3$, which load the desired pattern of logic states into the shift register 21. To be self-starting, the serial carry-in input may be connected to a reference supply of the appropriate parallel load level, such as a logical zero level voltage source for a shift register which is loaded by a logical zero level at the parallel load control input.

The outputs of $Q_0$–$Q_3$ of the shift register cells may be connected to the signal inputs, $X_0$–$X_3$, of multiplexer 22. The control signals applied to the control inputs, A, B, of multiplexer 22 may be internally decoded by multiplexer 22 to determine which signal input $X_0$–$X_3$ is connected to output Z.

A pattern 23 that may be programmed at the applied inputs, $D_0$–$D_3$, is a sequence of logical zero levels concatenated to a preamble of logical one levels. The same pattern may then be shared by all divisions requiring the same number of shifts prior to repeating a combination of partial divisions, as shown in the Table of FIG. 3. Different ¾ select line signal combinations are obtained from the same pattern by multiplexing different shift register cells to the ¾ select line.

As an example of the operation of the illustrated embodiment, consider the division of input frequency by a programmed divisor such as eleven. A frequency divide by eleven may be achieved by partially dividing the input frequency by three once, partially dividing by four twice and generating an output pulse before repeating the process. Thus, an integer multiplier of one multiplied with the partial divisor three plus an integer multiplier of two multiplied with the partial divisor four is equal to the desired programmed divisor eleven. Since the ¾ controller 19 must select a partial divisor three times before repeating (once for the divide by three plus twice for the divide by four) the logical one preamble must contain two logical one bits. Thus, after two shifts the $S_n$ cell of the shift register 21 will contain a logical zero level which will be produced at the output at one-eleventh the frequency of the applied signal at input 12. The signal on line 13 will cause the shift register 21 to be parallel loaded again with the initial pattern having two logical one bits in the preamble. Further, the multiplexer may be programmed at the control inputs, A, B, to select the shift register cell $Q_n$, and will receive two logical one levels followed by one logical zero level before repeating. This will set the ¾ select line 14 to a logical one level for two partial divide cycles of the ¾ divider 11 and a logical zero level for one partial divide cycle of the ¾ divider 11 before repeating the sequence. The net effect will cause the ¾ divider 11 to divide the input frequency by four twice and by three once and cause the ¾ controller to generate an output pulse once every eleven periods of the applied signal at input 12.

Figure 2:
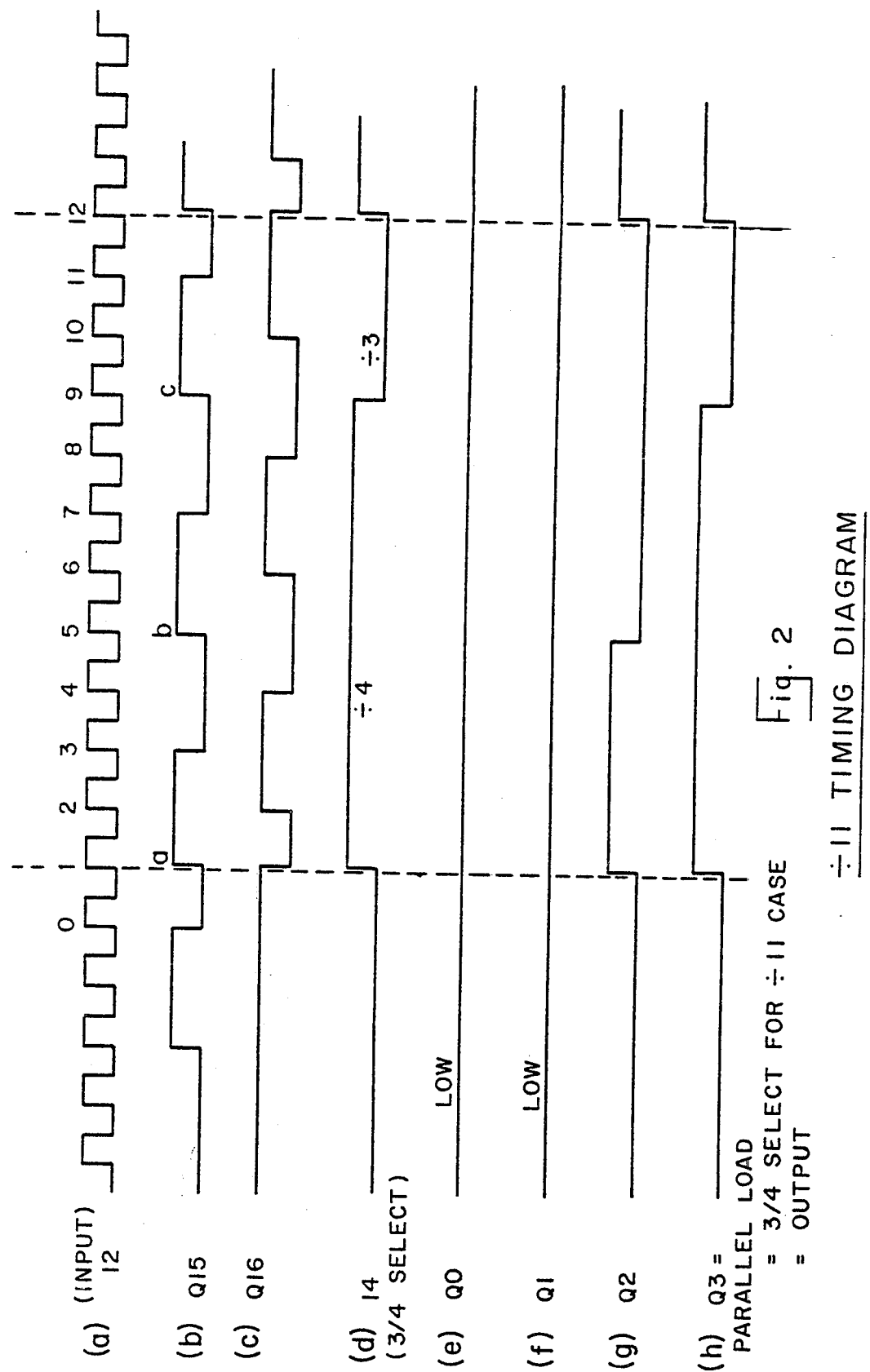
FIG. 2 is a timing diagram showing the logic states associated with an operating cycle of the divider circuit.

Referring now more specifically to the timing diagram of FIG. 2, the status of the logic signals is illustrated over a single divide-by-eleven cycle. Positive-going transitions of the input signal 12 clock the flip-flops 15 and 16 which form the divide-by-3 or 4 module. Similarly, positive-going transitions of the Q output of flip-flop 15 clock the flip-flops which form the shift register 21.

A series of cycles of the input signal 12 is shown in FIG. 2(a). The waveforms of FIGS. 2(b) and 2(c) labeled $Q_{15}$ and $Q_{16}$ describe the operation of the divide by 3 or 4. The waveform FIG. 2(c) of $Q_{16}$ is essentially the waveform FIG. 2(b) of $Q_{15}$ delayed by one input cycle of input signal 12. The waveform FIG. 2(d) for controlling the divide by 3 or 4, shows the pattern of logic states developed on the ¾ select line 14. Finally the waveforms FIGS. 2(e), (f), (g), (h) labeled $Q_0$, $Q_1$, $Q_2$ and $Q_3$ describe the outputs of the shift register 21.

During cycles of signal on the input 12, while the ¾ select line 14 is high, the $Q_{15}$ output undergoes a cycle every four input cycles. During cycles of the input while the ¾ select line is low, the $Q_{15}$ output is effectively inverted through gate 18 and wired-OR gate 17. This results in a high-level signal at the D input of flip-flop 15 after the $Q_{15}$ causes the $Q_{15}$ output to go high following the next positive transition of signal on input 12, as shown in FIG. 2(a). Therefore, while the ¾ select line 14 is low, the ¾ divider divides by 3.

The waveforms of FIGS. 2(e), (f), (g), and (h) labeled $Q_0$, $Q_1$, $Q_2$ and $Q_3$ describe the operation of the shift register 21 over divide-by-eleven cycle. $Q_3$ is connected in this embodiment to the parallel load control input of the shift register 21. To provide the proper pattern of logic levels on the ¾ select line for divide by eleven operation, the programming inputs of the multiplexer 22 must select the $Q_3$ output of the shift register 21 to apply to the ¾ select line. This is accomplished by applying a high logic level to both programming inputs A and B of the multiplexer 22. The programming inputs of the shift register 21 must also be properly selected. For a shift register 21 of Motorola type MC 10141, as shown, the $D_0$ and $D_1$ inputs must be low and the $D_2$ and $D_3$ inputs must be high. Additionally, the serial carry input, $D_L$, must be in the low state.

The shift register 21, once properly programmed, begins to shift its data to the right for the connection shown in FIG. 1. At input transition 1 of FIG. 2(a), the parallel load control input of shift register 21 is low and the positive transition, a, on $Q_{15}$ causes the shift register 21 to be parallel loaded with the programming data described above. On the next positive transition, b, FIG. 2(b), the data is shifted by one cell in the shift register 21. This causes the $Q_2$ output of shift register 21 to go low. Other shift register outputs are unchanged. On transition C of FIG. 2(b), the $Q_3$ line goes low due to the shift of the low level signal present on output $Q_2$. The output $Q_3$ is coupled to the ¾ select line, so the ¾ divider begins its divide by three sequence following transition C. The $Q_3$ output is connected to the parallel load control input, so the next positive transition of FIG. 2(b) causes the divide-by-eleven sequence to repeat. The $Q_3$ output is also connected to the output 20 for providing an output signal every eleven input cycles.

The Table of FIG. 3 contains programming information and ¾ sequence descriptions for other divide numbers. Division by eight, if needed, can be implemented by adding a wired-OR gate (not shown) between the multiplexer Z output and pin 5 of the gate 18. The other input of the wired-OR gate is held high during divide-by-eight operation and the shift register 21 is programmed for the divide-by-seven case. The A and B control inputs of the multiplexer 22 are redundant for this case.

I claim:

1. An apparatus for dividing the frequency of an applied signal by a programmable integer divisor comprising:

frequency divider means having an input connected to receive an applied signal having a frequency to be divided, having a control input for selecting one of a plurality of partial divisors wherein the sum of positive integer multiples of said partial divisors is equal to a desired programmed divisor, and having an output for generating a signal with a partially divided frequency of the applied signal frequency;

shift register means having a plurality of interconnected cells each capable of storing data, having a clock input connected to receive the output of the frequency divider means for producing a serial shift of the data in said cells, having a parallel load control input, having a data output from each of a plurality of said cells and having a data input to each of a plurality of said cells for loading programming signals applied thereto into said cells;

first means for connecting one of said data outputs, which generates the desired frequency divided signal, to said parallel load control input for loading said cells with a programming signal applied to said data inputs, in response to signal appearing on the clock input of said shift register means;

second means for connecting one of said data outputs to the control input of said frequency divider means; and said shift register means serially shifting said loaded data within said cells in response to the appearance of signals on the clock input of said shift register means to produce a change in the data in the cell having an output connected to the parallel load control input for causing a parallel load only after an integer number of serial shifts, where said integer number is equal to the sum of said integers which are multipliers of the partial divisors, and for serially shifting said loaded data to produce a change in the data in the cell having an output connected to the control input of said frequency divider means, where said change is capable of controlling the selection of said partial divisors a number of times equal to the integer multiplier of the selected partial divisor.

2. An apparatus as in claim 1 wherein:

said second means includes a multiplexer having a control input connected to receive an applied signal for selecting one of said cell outputs and applying the selected cell output to the control input of said frequency divider means.

3. A frequency divider for dividing the frequency of an applied binary signal by a programmable integer divisor comprising:

first bistable switching element having a first input connected to receive an applied binary signal with the frequency to be divided, having a second input, and having an output which generates a frequency divided signal equivalent to the state of the second input at the occurrence of the most recent signal at the first input;

second bistable switching element having a first input connected to receive an applied binary signal with the frequency to be divided, having a second input connected to receive the output of the first bistable element and having an output which generates a signal equivalent to the logical inverse of the state of the second input at the occurrence of the most recent signal at the first input;

selector means having a first input connected to receive the output of the first bistable switching element, having a second input connected to receive an applied divisor select signal for selecting a partial divisor of three or four, and having an output which generates a signal equivalent to the logical inverse of the logical OR combination of the inputs; and means coupling the output of the second bistable switching element and the output of the selector means to the second input of said first bistable switching element.

4. A frequency divider as in claim 3 wherein:

said first bistable switching element comprises a first flip-flop having a clock input connected to receive the applied signal with the frequency to be divided, having a data input, and having an output which generates a frequency-divided signal equivalent to the state of the data input at the occurrence of the most recent signal at the clock input;

second bistable switching element comprises a second flip-flop having a clock input connected to receive the applied binary signal with the frequency to be divided, having a data input connected to receive the output of the first flip-flop, and having an output which generates a signal equivalent to the logical inverse of the state of the data input at the occurrence of the most recent signal at the clock input; and selector means comprises a NOR gate having a first input connected to receive the output of the first flip-flop, having a second input connected to receive an applied divisor select signal for selecting a partial divisor of three or four, and having an output which generates a signal equivalent to the logical inverse of the logical OR combination of signals appearing at the first and second inputs thereof.

5. A frequency divider according to claim 4 comprising:

shift register means having a plurality of interconnected cells each capable of storing binary data, having a clock input connected to receive the output of the first bistable switching element for producing a serial shift of the data in said cells, having a parallel load control input, having a data output from each of a plurality of said cells, and having a data input to each of a plurality of said cells for loading programming signals applied thereto into said cells;

first means for connecting the one of said data outputs which generates the desired frequency divided signal to said parallel load control input for loading said cells with a programming signal applied to said data inputs in response to signal on the clock input of the shift register means;

second means for connecting one of said data outputs to the second input of said selector means; and said shift register means being responsive to signal on said clock input for loading said cells with programming signals applied to the data inputs in response to loaded data being shifted within the cells to produce a change in the logic level in the cell having an output connected to the parallel load control input after an integer number of serial shifts, said integer number being equal to the sum of two integers of which the first integer multiple of three plus the second integer multiple of four is equal to the desired programmed divisor, and said loaded data being serially shifted to produce a change in the logic level in the cell having an output connected to the second input of said selector means for controlling the selection of the partial division by three a number of times equal to said first integer and the partial division by four a number of times equal to said second integer.

6. A frequency divider according to claim 3 comprising:

shift register means having a plurality of interconnected cells each capable of storing binary data, having a clock input connected to receive the output of the first bistable switching element for producing a serial shift of the data in said cells, having a parallel load control input, having a data output from each of a plurality of said cells, and having a data input to each of a plurality of said cells for loading programming signals applied thereto into said cells;

first means for connecting the one of said data outputs which generates the desired frequency-divided signal to said parallel load control input for loading said cells with a programming signal applied to said data inputs in response to signal on said clock input;

second means for connecting one of said data outputs to the second input of said selector means; and said shift register means being responsive to signal on said clock input for loading said cells with programming signals applied to the data inputs in response to loaded data being shifted within the cells to produce a change in the logic level in the cell having an output connected to the parallel control input after an integer number of serial shifts, said integer number being equal to the sum of two integers of which the first integer multiple of three plus the second integer multiple of four is equal to the desired programmed divisor, and said loaded data being serially shifted to produce a change in the data in the cell having an output connected to the second input of said selector means for controlling the selection of the partial division by three a number of times equal to said first integer and the partial division by four a number of times equal to said second integer.

7. Apparatus for dividing the frequency of an applied signal by a programmable integer divisor comprising:
   divider means having a control input and having another input to receive applied signal for dividing the frequency thereof by an integer determined by a signal appearing on the control input;
   shift register means including a plurality of intercoupled data cells having outputs and having inputs for receiving applied data signals, the shift register means having a data loading control input for enabling the data cells to accept and store data signals which are applied to inputs of the data cells for parallel loading therein in response to a signal applied to the data loading control input thereof, said shift register means including a data shift input for sequentially shifting stored data signal between data cells in response to a signal applied to the data shift input thereof;
   means coupled to the data shift input for applying the divided frequency from the divider means thereto;
   means coupled to the shift register means for applying to the data loading control input thereof a signal from an output of a data cell representative of a data signal stored therein;
   means coupled to the control input of the divider means for applying thereto a signal from a selected output of a data cell representative of a data signal stored therein; and
   means coupled to an output of data cell for producing the divided frequency output.

8. Apparatus as in claim 7 wherein the means coupled to the control input of the divider means includes selectively switchable apparatus for connecting to the output of a selected data cell.

9. Apparatus as in claim 8 wherein the selectably switchable apparatus includes control inputs for accepting logic signals which determine the one of the data cell outputs that connects to the control input of the divider means.

10. Apparatus as in claim 7 comprising clock means coupled to said shift register means for synchronizing the shifting therein of the stored data signals and for synchronizing the parallel loading of applied data signals into said cells.

11. Method of dividing the frequency of an applied signal comprising the steps of:
   selecting a plurality of partial divisors, wherein the sum of integer multiples of the partial divisors equals the desired divisor;
   producing a signal having a plurality of logic states which may be logically shifted relative to a reference condition of logic states, which signal exhibits a change in the logic state relative to the reference condition only after an integer number of logical shifts of the signal where said integer number is equal to the sum of said integers which are multipliers of the partial divisors, and which plurality of logic states may be decoded to select each of said plurality of partial divisors a number of times equal to the integer multiplier of said selected partial divisors;
   decoding the signal of logic states to select one of said plurality of partial divisors;
   dividing an applied signal by the selected partial divisor to generate a partially divided output of the applied signal;
   logically shifting the signal of logic states in logic increments in a constant direction relative to the reference condition for each period of said partially divided output;
   repeating the decoding, dividing and logical shifting steps;
   generating an output signal having the desired divided frequency of the applied signal from the occurrence of said change in the logic state with respect to the reference condition; and
   restoring the signal of logic states to its original condition relative to the reference condition on the occurrence of the output signal generated by said change in the logic state with respect to the reference condition.

* * * * *

UNITED STATES PATENT AND TRADEMARK OFFICE
CERTIFICATE OF CORRECTION

PATENT NO. : 4,234,849
DATED : November 18, 1980
INVENTOR(S) : William J. Crilly, Jr.

It is certified that error appears in the above-identified patent and that said Letters Patent are hereby corrected as shown below:

Column 1, line 67, "Q output of flip-flop 16" should read -- $\overline{Q}$ output of flip-flop 16 --;

Column 2, line 17, "contrller" should read -- controller --;

Column 3, line 44, before "causes" insert -- output goes low. A high level on the D input of flip-flop 15 --;

Column 5, line 23, before "element" insert -- switching --.

Signed and Sealed this

Fifth Day of May 1981

[SEAL]

Attest:

RENE D. TEGTMEYER

Attesting Officer        Acting Commissioner of Patents and Trademarks